(12) United States Patent
Pentlehner et al.

(10) Patent No.: US 10,074,829 B2
(45) Date of Patent: Sep. 11, 2018

(54) OPTOELECTRONIC COMPONENT DEVICE, METHOD FOR PRODUCING AN OPTOELECTRONIC COMPONENT DEVICE, AND METHOD FOR OPERATING AN OPTOELECTRONIC COMPONENT DEVICE

(71) Applicant: Osram OLED GmbH, Regensburg (DE)

(72) Inventors: Dominik Pentlehner, Regensburg (DE); Kilian Regau, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/305,678

(22) PCT Filed: Apr. 28, 2015

(86) PCT No.: PCT/EP2015/059174
§ 371 (c)(1),
(2) Date: Oct. 21, 2016

(87) PCT Pub. No.: WO2015/165888
PCT Pub. Date: Nov. 5, 2015

(65) Prior Publication Data
US 2017/0047539 A1    Feb. 16, 2017

(30) Foreign Application Priority Data
Apr. 30, 2014    (DE) .................. 10 2014 106 069

(51) Int. Cl.
*H01L 51/52*    (2006.01)
*H05B 33/08*    (2006.01)
*H01L 51/56*    (2006.01)

(52) U.S. Cl.
CPC ........ *H01L 51/529* (2013.01); *H01L 51/5237* (2013.01); *H01L 51/56* (2013.01); *H05B 33/0896* (2013.01)

(58) Field of Classification Search
CPC ...... H01L 51/56; H01L 51/529; H01L 51/537
See application file for complete search history.

(56) References Cited

U.S. PATENT DOCUMENTS

| 2007/0171145 A1 | 7/2007 | Coleman et al. |
| 2008/0006843 A1* | 1/2008 | Dai ............ H01L 25/167 257/99 |

(Continued)

FOREIGN PATENT DOCUMENTS

| DE | 102011088407 A1 | 6/2013 |
| JP | 2004342557 A | 12/2004 |
| WO | 2013092344 A1 | 6/2013 |

OTHER PUBLICATIONS

German Search Report based on application No. 10 2014 106 069.5 (8 pages) dated Mar. 25, 2015 (Reference Purpose Only).

(Continued)

*Primary Examiner* — Douglas W Owens
*Assistant Examiner* — Pedro C Fernandez
(74) *Attorney, Agent, or Firm* — Viering Jentschura & Partner MBB

(57) ABSTRACT

In various embodiments, an optoelectronic component device is provided. The optoelectronic component device may include a linear regulator designed for providing an electric current; an optoelectronic component formed for converting the electric current into an electromagnetic radiation; and an electrothermal transducer designed for converting the electric current into a temperature difference. The electrothermal transducer is thermally coupled to the optoelectronic component, and the optoelectronic component (Continued)

and the electrothermal transducer are electrically coupled in series with the linear regulator.

10 Claims, 7 Drawing Sheets

(56) References Cited

U.S. PATENT DOCUMENTS

| | | | | |
|---|---|---|---|---|
| 2009/0129111 A1* | 5/2009 | Ito | .................. | F21S 48/1154 |
| | | | | 362/547 |
| 2009/0153007 A1* | 6/2009 | Jiang | .................. | H01L 35/30 |
| | | | | 313/11 |
| 2014/0070190 A1* | 3/2014 | Chen | .................. | H01L 27/3225 |
| | | | | 257/40 |
| 2014/0346959 A1 | 11/2014 | Maiwald et al. | | |

OTHER PUBLICATIONS

International Search Report based on application No. PCT/EP2015/059174 (4 pages and 2 pages of English translation) dated Sep. 21, 2015 (Reference Purpose Only).

* cited by examiner

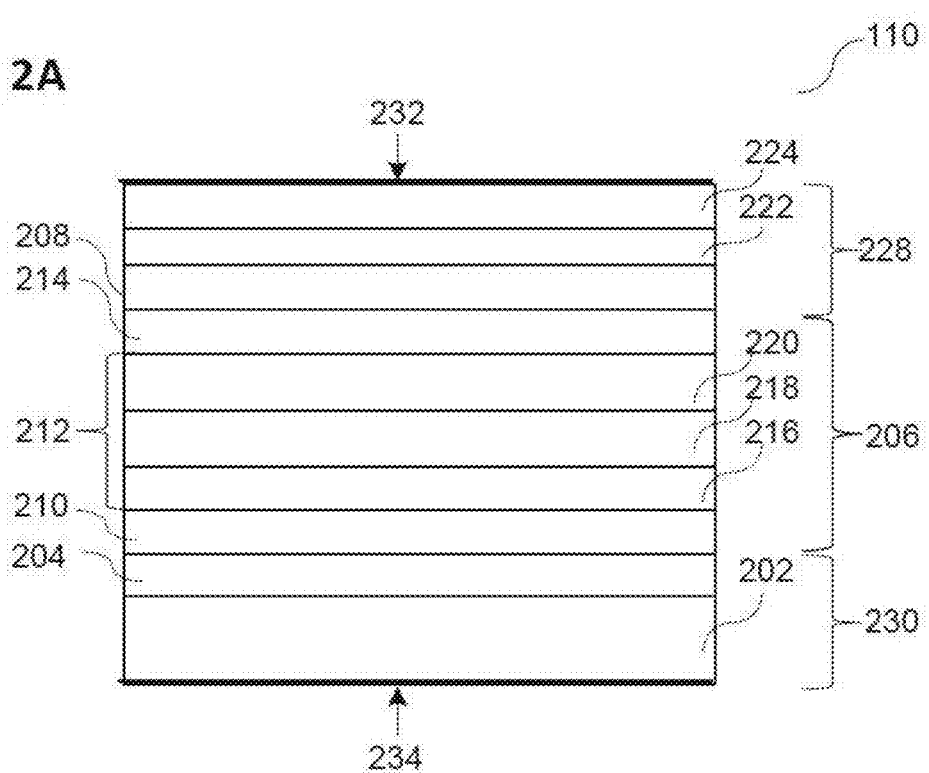

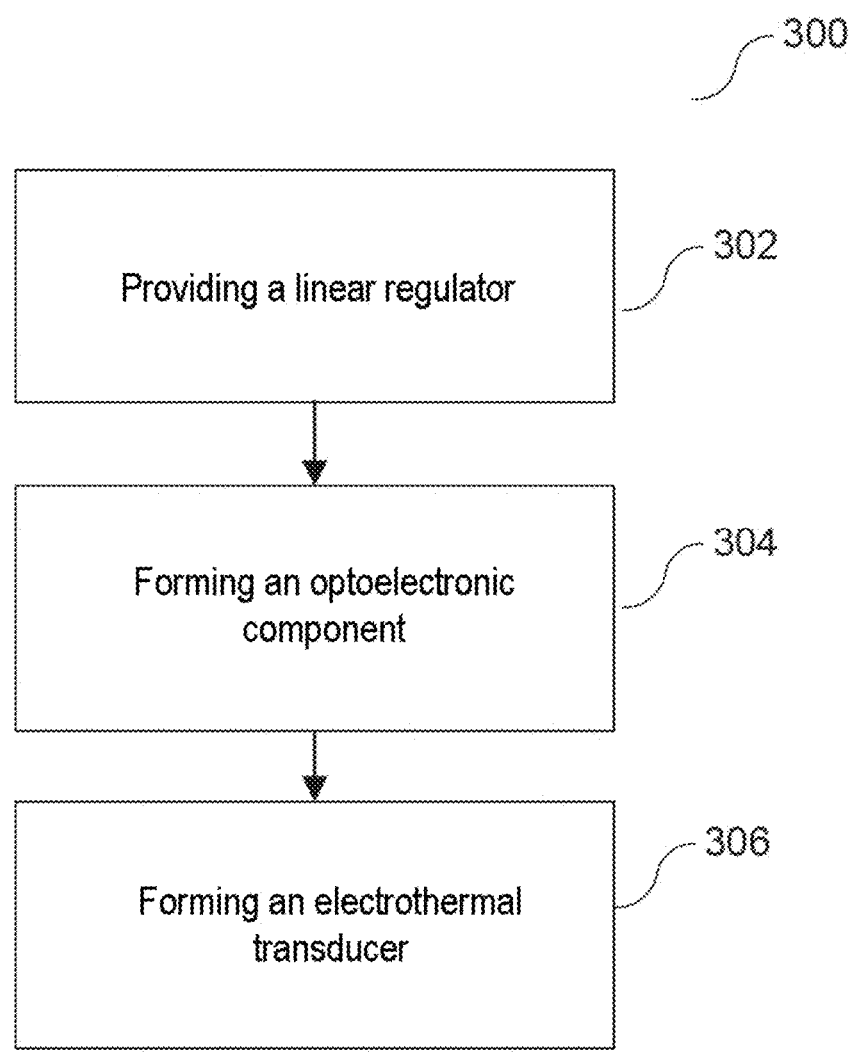

OPTOELECTRONIC COMPONENT DEVICE, METHOD FOR PRODUCING AN OPTOELECTRONIC COMPONENT DEVICE, AND METHOD FOR OPERATING AN OPTOELECTRONIC COMPONENT DEVICE

RELATED APPLICATIONS

The present application is a national stage entry according to 35 U.S.C. § 371 of PCT application No.: PCT/EP2015/059174 filed on Apr. 28, 2015, which claims priority from German application No.: 10 2014 106 069.5 filed on Apr. 30, 2014, and is incorporated herein by reference in its entirety.

TECHNICAL FIELD

In various embodiments, an optoelectronic component device, a method for producing an optoelectronic component device and a method for operating an optoelectronic component device are provided.

BACKGROUND

A conventional organic light emitting diode includes above a substrate an anode and a cathode with an organic functional layer system between the anode and cathode. The organic functional layer system may include one or a plurality of emitter layer(s) in which electromagnetic radiation is generated, one or a plurality of charge generating layer structure(s) each composed of two or more charge generating layers (CGL) for charge generation, and one or a plurality of electron blocking layer(s), also designated as hole transport layer(s) (HTL), and one or a plurality of hole blocking layer(s), also designated as electron transport layer(s) (ETL), in order to direct the current flow.

The limiting factor at present for the use of OLEDs in applications with a large temperature range is the operating life. It decreases greatly as a result of temperature increase, often for example by a factor of 3 upon an increase in the temperature of the OLED from 25° C. to 50° C. and by a further factor of 2 to 3 upon an increase from 50° C. to 75° C. The operating life in the case of a conventional OLED can be increased at a predefined ambient temperature by optimizing the organic functional layer system and the encapsulation. By way of example, the design of the OLED, for example the ratio of the marginal area to the luminous area, may be of importance for the intrinsic heating of the OLED. The thermal coupling of the OLED to other components may likewise lead to heat dissipation from the OLED, that is to say that part of the heat arising at the OLED may be dissipated. In a conventional method, the OLED is actively cooled by a Peltier element. However, the Peltier element is conventionally always an additional power consumer.

The current-voltage characteristic curve (I-U characteristic curve) of conventional OLEDs is greatly temperature-dependent. For the operation of an OLED with a predefined current density or luminance, a different voltage is required at different temperatures. In conventional OLEDs, the forward voltage thus varies greatly with the ambient temperature. Compared with operation at room temperature or higher temperatures, the OLEDs at low temperatures require a relatively high voltage for the rated current. For current regulation in light emitting diodes in the automotive sector, clocked switch mode power supplies (SMPS) and linear regulators are used. For applications in a large temperature range, for example in automotive applications, with the use of linear regulators, therefore, the maximum voltage dropped across the OLED is kept available for the entire temperature range.

In the case of a circuit including a linear regulator 504, the maximum voltage $U_{OLED}$ dropped across the OLED 502 is kept available as DC voltage, illustrated in FIG. 5. The voltage $U_{reg}$ ($U_{reg}=U_{in}-U_{OLED}$) not required by the OLED 502 is dropped across the linear regulator 504. The linear regulator 504 acts as a regulated variable resistor. The input voltage of the linear regulator is conventionally designed to be high enough that current is still supplied to the OLED at low temperatures. However, if the temperature of the OLED is high, at the linear regulator a very high voltage difference between input and OLED is compensated for in the form of waste heat at the linear regulator. At high ambient temperatures of the OLED 502, a large amount of heat is thus generated at the linear regulator 504. That is to say that the voltage difference $U_{reg}$ between the maximum power required by the OLED 502 and the power required at a specific temperature is dropped across the linear regulator 504 and is converted into waste heat. With the use of linear regulators 504, the input voltage $U_{in}$ is always greater than the forward voltage $U_{OLED}$ required for the load current $I_{OLED}$, for example OLED rated current. The difference $U_{reg}$ between input voltage $U_{in}$ and (O)LED voltage $U_{OLED}$ is dropped across the linear regulator and is converted into thermal power at the linear regulator 504 by the flowing rated current $I_{OLED}$. In order to increase the efficiency, this voltage difference should be minimal. At a given input voltage $U_{in}$, the tolerances of the OLED voltage $U_{OLED}$ should keep within the narrowest possible limits. The tolerances of the OLED voltage $U_{OLED}$ may be temperature-dependent, dictated by aging and/or dictated by manufacturing, for example. This can lead to thermal problems on the circuit board of the linear regulator 504 or require a higher outlay in the heat dissipation from the linear regulator 504, for example a larger heat sink. On account of the large voltage range, the efficiency of the entire lighting device is primarily low at high temperatures.

Therefore, in driver development recourse is conventionally had to switch mode power supply technology, which is replete with disturbances and relatively expensive. In this case, a DC voltage above the required maximum voltage of the OLED is converted into an AC voltage by a switch with a specific clock frequency. The AC voltage is rectified again and applied to the OLED. The DC voltage for the OLED can be varied by the clock frequency and the switching times (switches open/closed). The voltage can be varied with low losses which leads to high efficiency. However, the voltage at the OLED is not a pure DC voltage, but rather has voltage and/or current fluctuations (ripple), which are undesirable, however, at the OLED. Moreover, a high-frequency electromagnetic radiation is generated by virtue of the conversion of the clocked DC voltage into the AC voltage. Said high-frequency electromagnetic radiation can interfere with other applications, and is therefore measured and subjected to interference suppression in a complex manner. Furthermore, a higher outlay for the OLED, the circuit and the design is required in the case of a clocked voltage regulator compared with a linear regulator.

The circuit including a linear regulator 504 is simple, cost-effective and immune to interference compared with the clocked voltage regulator and no interfering electromagnetic fields are generated. However, the linear regulator 504 has a lower efficiency than switch mode power supplies. However, the clocked switch mode power supply has a significantly greater electromagnetic radio-frequency interference (electromagnetic interference, EMI). In a manner governed by the application, the switch mode power supplies are generally damped or subjected to interference suppression in a manner that is complex in terms of development and costly.

SUMMARY

In various embodiments, an optoelectronic component device, a method for producing an optoelectronic component device and a method for operating an optoelectronic component device are provided, which make it possible to increase the operating life of OLEDs in a large temperature use range in a cost-effective manner. The temperature dependence of the voltage dropped across a linear regulator of the optoelectronic component device is reduced, such that the heating of the linear regulator is reduced. The energy normally "wasted" at the linear regulator is used for cooling the optoelectronic component. Furthermore, in various embodiments, the encapsulation structure of the optoelectronic component can be simplified by virtue of a cover of the encapsulation structure, for example a cover glass or encapsulation cover, being replaced by an electrothermal transducer, for example a Peltier element. Depending on prioritization/weighing up of service life, energy efficiency, costs, electromagnetic radio-frequency interference, a linear regulation of optoelectronic components becomes technically interesting again.

In various embodiments, an optoelectronic component device is provided. The optoelectronic component device includes a linear regulator designed for providing an electric current; an optoelectronic component formed for converting the electric current into an electromagnetic radiation; and an electrothermal transducer. The electrothermal transducer is thermally coupled to the optoelectronic component. The optoelectronic component, the electrothermal transducer and the linear regulator are electrically connected in series with one another.

In one configuration, the linear regulator may be or include a series regulator.

In another configuration, the optoelectronic component may include a substrate, and an electrically active region on the substrate, wherein the electrically active region is formed for converting the electric current into the electromagnetic radiation.

In another configuration, the optoelectronic component can furthermore include an encapsulation structure on or above the electrically active region, wherein the encapsulation structure is formed in such a way that it protects the electrically active region against indiffusion of a substance that is harmful to the electrically active region.

In another configuration, the encapsulation structure may include the electrothermal transducer or be thermally coupled thereto, and/or the substrate may include the electrothermal transducer or be thermally coupled thereto.

In another configuration, the optoelectronic component can be or include an organic light emitting diode.

In another configuration, the electrothermal transducer may include a Peltier element or be formed in this way.

In another configuration, the electrothermal transducer may include or be thermally coupled to a heat distribution structure. The heat distribution structure can be arranged in a manner facing away from the optoelectronic component.

In another configuration, the electrothermal transducer may include one or a plurality of electrothermal transducer(s).

In another configuration, the electrothermal transducer can be formed on the optoelectronic component. Alternatively, the optoelectronic component can be formed on the electrothermal transducer.

In another configuration, a heat conducting structure can furthermore be arranged between the optoelectronic component and the electrothermal transducer.

In another configuration, the optoelectronic component can be thermally and/or electrically coupled to the electrothermal transducer by the heat conducting structure.

In another configuration, the optoelectronic component device can furthermore include a switch circuit formed for electrically bridging the/an electrothermal transducer on a predefined operating parameter being attained. The predefined operating parameter can be selected in an application-specific manner, for example.

An operating parameter may include or be one or a plurality of operating parameters, for example as a set of operating parameters. An operating parameter has a value, a sign and a unit and is referred to as operating parameter for simplification. By way of example, the operating parameter can be or include a temperature having a temperature value of the optoelectronic component, of the electrothermal transducer and/or of the optoelectronic component device. Alternatively or additionally, an operating parameter can be or include a voltage drop across the optoelectronic component and/or the electrothermal transducer. Alternatively or additionally, an operating parameter can be or include an electric current through the optoelectronic component and/or the electrothermal transducer.

In another configuration, the switch circuit may include a determiner circuit, wherein the determiner circuit is formed for determining an operating parameter, for example the temperature; for example of the optoelectronic component, for example of the optoelectronic component device. The determiner circuit is coupled to the electrically switchable switch in such a way that the switch switches the bridging of the electrothermal transducer on the basis of the comparison of the measured operating parameter with respect to the predefined operating parameter.

In various embodiments, a method for producing an optoelectronic component device is provided. The method includes providing a linear regulator designed for providing an electric current. Furthermore, the method includes forming an optoelectronic component formed for converting the electric current into an electromagnetic radiation. Furthermore, the method includes forming an electrothermal transducer. The electrothermal transducer is thermally coupled to the optoelectronic component. The optoelectronic component, the electrothermal transducer and the linear regulator are electrically connected in series with one another.

In various configurations, the method for producing an optoelectronic component device may include features of the optoelectronic component device; and the optoelectronic component device may include features of the method for producing the optoelectronic component device in such a way and insofar as the features are expediently applicable in each case.

In various embodiments, a method for operating an optoelectronic component device in accordance with one of the configurations is provided. The method includes determining an operating parameter of the optoelectronic component. Furthermore, the method includes comparing the determined operating parameter with the predefined operating parameter. Furthermore, the method includes changing or leaving the position of the switch on the basis of the result of the comparison.

In one configuration, comparing may include determining the difference between measured operating parameter and predefined operating parameter.

In one configuration, switching can be carried out on the basis of a change in sign of the temperature difference.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 2A-2C show schematic illustrations of various embodiments of an optoelectronic component device;

FIG. 3 shows a schematic illustration of a method for producing an optoelectronic component device in accordance with various embodiments;

DETAILED DESCRIPTION

Figure 1A:
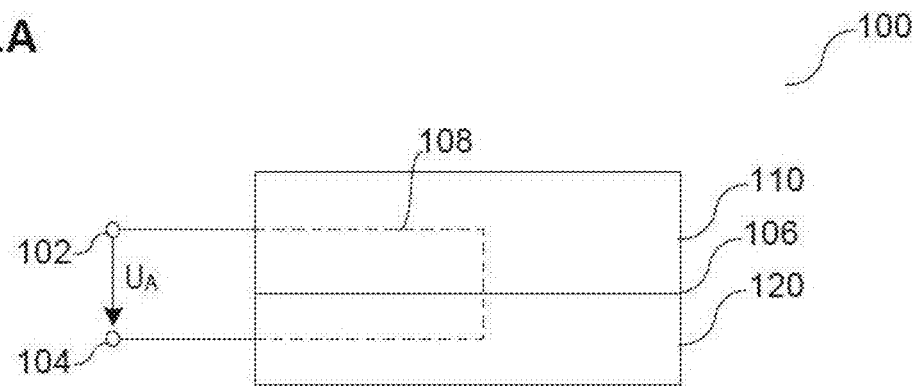
FIGS. 1A-1C show schematic illustrations concerning optoelectronic component devices in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, optoelectronic components are provided, wherein an optoelectronic component includes an optically active region. The optically active region can emit electromagnetic radiation by a voltage applied to the optically active region. In various embodiments, the optoelectronic component can be formed in such a way that the electromagnetic radiation has a wavelength range including x-ray radiation, UV radiation (A-C), visible light and/or infrared radiation (A-C).

An optoelectronic component can be formed for example as a light emitting diode (LED), as an organic light emitting diode (OLED), as a light emitting transistor or as an organic light emitting transistor, for example an organic field effect transistor (OFET) and/or an organic electronic system. Furthermore, a plurality of electromagnetic radiation emitting components can be provided, for example in a manner accommodated in a common housing. An optoelectronic component may include an organic functional layer system, which is synonymously also designated as organic functional layer structure. The organic functional layer structure may include or be formed from an organic substance or an organic substance mixture which is designed for example for emitting an electromagnetic radiation from an electric current provided.

An organic light emitting diode can be formed as a so-called top emitter and/or a so-called bottom emitter. In the case of a bottom emitter, electromagnetic radiation is emitted from the electrically active region through the carrier. In the case of a top emitter, electromagnetic radiation is emitted from the top side of the electrically active region and not through the carrier.

A top emitter and/or bottom emitter can also be formed as optically transparent or optically translucent; by way of example, each of the layers or structures described below can be or be formed as transparent or translucent with respect to the absorbed or emitted electromagnetic radiation.

In various embodiments, an optoelectronic component device 100 includes an optoelectronic component 110 and an electrothermal transducer 120. The optoelectronic component 110 is coupled to the electrothermal transducer 120 thermally (for example illustrated in FIG. 1A by the common interface 106) and electrically (for example illustrated in FIG. 1A owing to the electrical connection 108).

Figure 1B:
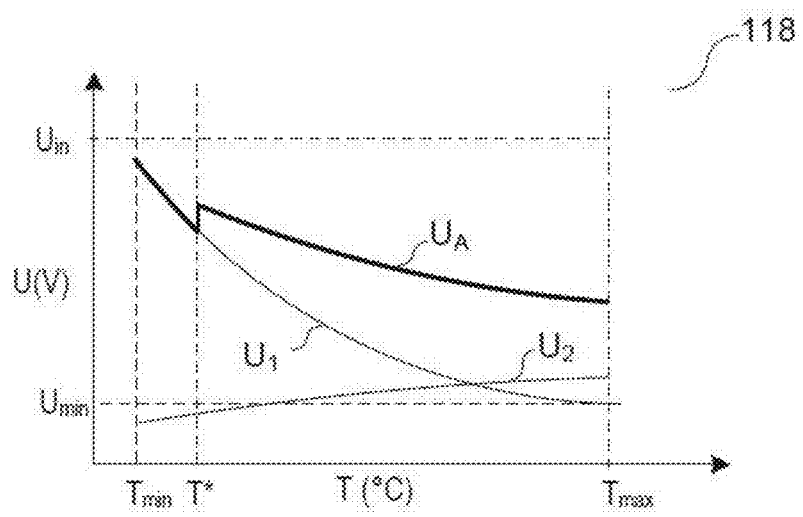
Figure 1C:
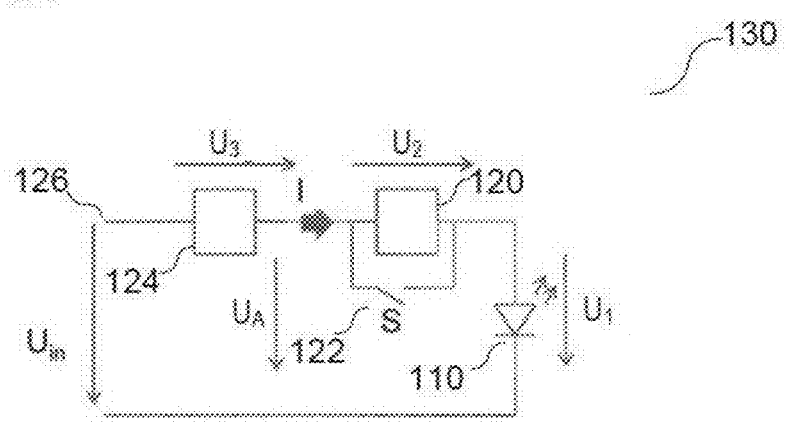

The optoelectronic component 110, the electrothermal transducer 120 and the linear regulator 124 are electrically connected in series with one another, for example illustrated in FIG. 1C.

The operating voltage $U_1$ is used for operating the optoelectronic component 110 with a current I. An operating voltage $U_2$ is used for operating the electrothermal transducer 120 with a current I, for example illustrated in the voltage-temperature diagram 118 in FIG. 1B. The output voltage $U_A$ is dropped across the terminals 102, 104 of the optoelectronic component 110 and of the electrothermal transducer 120, where:

$$U_A = U_1 + U_2. \tag{1}$$

An electrical input voltage $U_{in}$ is provided to the optoelectronic component device 100 from an electrical energy source 126, for example illustrated in FIGS. 1B and 1C. The difference voltage between input voltage $U_{in}$ and output voltage $U_A$ is dropped across the linear regulator 124 as voltage $U_3$ during operation:

$$U_3 = U_{in} - U_A. \tag{2}$$

During operation, depending on the configuration of the regulator 124, a minimum voltage $U_3$ (minimum) is dropped across the linear regulator 124, for example 1.5 V. This minimum voltage is independent of the load ($U_A$) connected to the linear regulator 124. For the operation of the optoelectronic component 110, at the maximum permissible temperature for the optoelectronic component 110, the minimum voltage $U_{min}$ is required, for example in a range of 4 V to 5 V.

The operating voltages $U_{1, 2}$ are dependent on the temperature T of the optoelectronic component device 100, for example on the temperature T of the optoelectronic component 110 and that of the electrothermal transducer 120, for example illustrated in FIG. 1B.

The energy source 126 provides the voltage $U_{in}$ in the circuit with the linear regulator 124 for the ambient temperature range of $T_{min}$ to $T_{max}$, for example of −40° C. to +85° C., said voltage being constant for example in the temperature range. As already described above in (2), the difference voltage is dropped across the linear regulator 124 as voltage $U_3$ in the form of waste heat, and can also be referred to as regulator range. The ambient temperature range is the temperature range of the surroundings external to the component device. Alternatively, the ambient temperature range is the temperature range of the surroundings external to the component, for example for the case where the optoelectronic component is thermally isolated from further components of the optoelectronic component device, or vice versa.

In various embodiments, the optoelectronic component device 100 includes a linear regulator 124. The linear regulator 124 is designed for providing an electric current I.

In various embodiments, the linear regulator 124 is or includes a series regulator. The series regulator is or includes an adjustable current regulator, for example a two-terminal current source and/or a constant-current regulator; and/or an adjustable voltage regulator, or is configured in this way. In addition, the linear regulator 124 may include a quadrature regulator. By way of example, a switch circuit, as described more thoroughly for example below, may include a quadrature regulator in order to conduct part of the current past the electrothermal transducer, for example to a further electrothermal transducer or a further component.

In various embodiments, the optoelectronic component device 100 includes an electrical energy source 126. The linear regulator 124 is electrically coupled to the electrical energy source 126 in such a way that the linear regulator 124 provides the electric current I.

The electrical energy source 126 is formed for providing the electric current I, for example in a temperature range of the optoelectronic component device 100 of approximately −40° C. to approximately +85° C.

In various embodiments, the optoelectronic component 110 includes an organic functional layer structure 212 including an electroluminescent substance designed for converting the electric current I into an electromagnetic radiation.

In various embodiments, the electromagnetic radiation is or includes a visible light or an infrared radiation.

In various embodiments, the operating life of the optoelectronic component is increased by an active cooling of the optoelectronic components during operation. In various embodiments, the active cooling is realized, inter alia, by an electrothermal transducer 120.

In various embodiments, the electrothermal transducer 120 is or includes a Peltier element.

In various embodiments, the electrothermal transducer 120 is formed and thermally coupled to the optoelectronic component 110 in such a way that the electrothermal transducer 120 during operation has a first surface having a first temperature and a second surface having a second temperature, wherein the second temperature is less than the first temperature, wherein the difference between first temperature and second temperature is a temperature difference. In various embodiments, the first surface or the second surface is coupled to the optoelectronic component 110. In various embodiments, the electrothermal transducer 120 is arranged for cooling and/or heating the optoelectronic component 110.

By the electrothermal transducer 120, for example a Peltier element, the operating life of the optoelectronic component 110 can be increased, which can be operated in a large temperature range ($T_{max}-T_{min}>\sim 50°$ C.), for example OLEDs in the automotive sector on the basis of an economic and design-technological consideration, for example with an optically active area of a few $cm^2$, for example up to approximately 16 $cm^2$. In addition, the power loss $U_3 \cdot I$ of the linear regulator 124 can thus be reduced, and the heating and thermal loading thereof can thus be reduced. The interconnection, for example illustrated in FIG. 1C, enables the electrothermal transducer 120 to use part of the energy conventionally converted in the linear regulator 124 for cooling the optoelectronic component. The optoelectronic component 110 has a higher service life at lower temperature. Consequently, the operating life of the optoelectronic component 110 can be increased by the cooling by the electrothermal transducer 120 with the same power balance of the optoelectronic component device 100. In other words: the energy normally "wasted" at the linear regulator 124 is used for cooling the optoelectronic component 110 and thus increases the operating life of the optoelectronic component 110. Moreover, the heat dissipation from the optoelectronic component 110 reduces the heating of the linear regulator 124 since the voltage drop $U_3$ across the linear regulator 124 is reduced by the voltage drop $U_2$ across the electrothermal transducer 120. Consequently, for lengthening the operating life, no electrical energy above that which is already to be provided is required or consumed. Consequently, depending on the prioritization or weighing up of service life, energy efficiency, costs and electromagnetic radio-frequency interference, a linear regulation can generally become technically interesting again for the application of the optoelectronic component.

Furthermore, the electrothermal transducer can act as an encapsulation structure, for example anti-scratch protection.

In various embodiments, a clocked voltage and/or current regulator can be used instead of a linear regulator 124. As a result, the operating life of the optoelectronic component 110 can be increased as in the case of the linear regulator 124. A dedicated regulating circuit for the feeding of the electrothermal transducer 120 is obviated by virtue of the series connection. The clocked voltage and/or current regulator can be concomitantly used without high additional outlay in the circuit for the optoelectronic component 110, wherein the electrothermal transducer 120 may require an additional power, however, in the case of a clocked voltage regulator.

In various embodiments, the electrothermal transducer 120 includes or is thermally coupled to a heat distribution structure. The heat distribution structure is arranged for example in a manner facing away with respect to the optoelectronic component 110.

In various embodiments, the heat distribution structure is an active heat distribution structure, for example a heat conducting tube, a fan and/or a further electrothermal transducer 120.

In various embodiments, the heat distribution structure is a passive heat distribution structure, for example a heat sink.

In various embodiments, the heat distribution structure has a first surface and a second surface, wherein the first surface and/or the second surface are formed for the heat exchange of the heat distribution structure, for example are not thermally isolated from one another. The first surface of the heat distribution structure can be thermally coupled for example to the second surface of the electrothermal transducer 120, and the second surface of the heat distribution structure can be thermally isolated from the optoelectronic component device 100.

In various embodiments, the electrothermal transducer 120 includes one or a plurality of electrothermal transducer(s) 120. In various embodiments, an electrothermal transducer 120 includes one or a plurality of Peltier elements.

In various embodiments, at least one further electrothermal transducer 120 is thermally coupled to the first electrothermal transducer 120 in such a way that the further electrothermal transducer 120 has a third surface having approximately the second temperature and a fourth surface having a third temperature, wherein the absolute value of the temperature difference between the third temperature and the first temperature is greater than the absolute value of the temperature difference between the second temperature and the first temperature.

In various embodiments, the further electrothermal transducer 120 is electrically coupled in series with the first electrothermal transducer 120. Alternatively or additionally, the/a further electrothermal transducer 120 is electrically coupled in parallel with the first electrothermal transducer 120.

In various embodiments, the electrothermal transducer 120 is thermally coupled to the optoelectronic component 110.

In various embodiments, the electrothermal transducer 120 is formed on the optoelectronic component 110. Alternatively, the optoelectronic component 110 is formed on the electrothermal transducer 120.

In various embodiments, a heat conducting structure is furthermore formed between the optoelectronic component 110 and the electrothermal transducer 120. The optoelectronic component 110 is thermally and/or electrically coupled to the electrothermal transducer 120 for example by the heat conducting structure, for example illustrated by the contact 106 in FIG. 1A.

In various embodiments, the heat conducting structure is or includes a thermally conductive paste.

In various embodiments, the thermally conductive paste is formed as a thermally conductive adhesive layer and the optoelectronic component 110 is connected to the electrothermal transducer 120 by the thermally conductive adhesive layer. Alternatively or additionally, the heat conducting structure is or includes a thermally conductive film, for example a metal-containing film.

In various embodiments, the electrothermal transducer 120 is arranged at a distance from the optoelectronic component 110 in such a way that an air gap or vacuum between the electrothermal transducer 120 and the optoelectronic component 110 is formed; for example at a distance of less than 1 µm, for example less than 0.5 µm; for example less than 0.1 µm.

In various embodiments, the optoelectronic component 110 and the electrothermal transducer 120 are electrically coupled in series with the linear regulator 124. In various embodiments, the optoelectronic component device 100 includes an electrical wire connection, wherein the optoelectronic component 110 and the electrothermal transducer are electrically coupled by the wire connection. Alternatively or additionally, the optoelectronic component 110 and the electrothermal transducer include a common electrically conductive layer and are electrically coupled by the latter, for example by a common electrode.

In various embodiments, the optoelectronic component device includes a switch circuit 122 formed for electrically bridging the electrothermal transducer 120 upon a predefined operating parameter being attained, for example a predefined temperature T*, for example illustrated in FIG. 1B. In various embodiments, a predefined temperature T* is the temperature at which the electrothermal transducer 120 is bridged. By way of example, after a bridging, $U_A$ may be equal to $U_1$, for example illustrated in FIG. 1B by the discontinuity of $U_A$ at T*.

In various embodiments, an operating parameter is or includes one or a plurality of operating parameters, for example as a set of operating parameters. By way of example, the operating parameter can be or include a temperature of the optoelectronic component, of the electrothermal transducer and/or of the optoelectronic component device and/or of the ambient temperature of the component device. Alternatively or additionally, an operating parameter can be or include a voltage drop across the optoelectronic component and/or the electrothermal transducer. Alternatively or additionally, an operating parameter can be or include an electric current through the optoelectronic component and/or the electrothermal transducer. In various embodiments, the switch circuit 122 includes a determiner circuit, for example control electronics. The determiner circuit is formed for determining at least one operating parameter. The determiner circuit can determine, for example measure, for example the voltage drop across the linear regulator 124 and/or across the optoelectronic component 110 OLED; and/or measure the temperature. Depending on the determined operating parameter, for example the determined or measured temperature, the determined or measured voltage and/or the determined or measured current, the determiner circuit can for example decide, for example by a logic circuit, whether the electrothermal transducer 120 is intended to be connected or bridged.

The switch circuit 122 can be formed in such a way that it itself switches if the measured operating parameter reaches, for example undershoots or exceeds, the predefined operating parameter. For example if the measured temperature of the optoelectronic component 100 reaches, for example exceeds or undershoots, a predefined temperature T*, for example as a temperature switch, for example in the form of a bimetallic switch or a thermistor.

Alternatively or additionally, the switch circuit 122 may include an electrically switchable switch S, for example a transistor, a thyristor, for example a thermally switchable thyristor; and/or an integrated circuit, for example including a logic circuit.

In the case of an electrically switchable switch S, the switch circuit 122 may include a determiner circuit. The determiner circuit is formed for determining at least one operating parameter, for example the temperature T at least of the optoelectronic component 110, for example of the optoelectronic component device 100. The determiner circuit is coupled to the electrically switchable switch S in such a way that the switch S switches the bridging of the electrothermal transducer on the basis of the comparison of the determined operating parameter with respect to a predefined operating parameter, for example the ratio of the temperature T to the predefined temperature T*. By way of example, the switch S can switch the bridging by determining the temperature difference of the temperature T relative to the predefined temperature T*. Determining the temperature difference can be carried out for example in an integrated circuit. The predefined operating parameter can be provided in an electrical memory coupled to the integrated circuit, or at an input of the integrated circuit.

In the case of an operating parameter set including at least a first operating parameter and a second operating parameter, in the decision as to whether the switch S is intended to be switched, the first operating parameter can have a higher weighting than the second operating parameter. By way of example, the switch S can be switched if the first operating parameter reaches the predefined operating parameter and the second operating parameter does not. The weighting can be realized for example by a logic circuit for example by an order, for example by determiner loops in which the operating parameters are determined.

A Peltier element is for example suitable for the cooling of small areas, for example areas having a surface area of a few cm². An electrical power is necessary for the active cooling of the optoelectronic component 110, as a result of which the power efficiency of the entire optoelectronic component device 100 can be reduced. In various embodiments, the electrothermal transducer 120 together with the linear regulator 124 is electrically connected in series with the optoelectronic component 110. As a result, the operating current I of the optoelectronic component 110 flows through the electrothermal transducer 120. In various embodiments, the electrothermal transducer 120, for example in the form of a Peltier element, has a first surface having a first temperature and a second surface having a second temperature, wherein the first temperature is less than the second temperature, and wherein the first surface is thermally coupled to the second surface in such a way that a heat flow from the first surface to the second surface can take place. For cooling the optoelectronic component 110, the first surface is thermally coupled to the optoelectronic component 110. For heating the optoelectronic component 110, the second surface is thermally coupled to the optoelectronic component 110.

In various embodiments, the electrothermal transducer 120 is thermally coupled by the first surface, that is to say by the cooling side, to the optoelectronic component 110, for example is adhesively bonded onto the optoelectronic component using a thermally conductive adhesive. Additionally or alternatively, the choice of whether the first surface or the second surface of the electrothermal transducer 120 is thermally coupled to the optoelectronic component 110 can be carried out electrically, for example by one or more switches of the switch circuit, for example by setting the current direction through the electrothermal transducer 120. For this purpose, the switch circuit 122 may include a switch arrangement, for example, which can be used to set the current direction through the electrothermal transducer 120 in the series connection.

In various embodiments, the electrothermal transducer 120 is formed as a part of the encapsulation structure 228 of the optoelectronic component 110, for example as a cover.

At high temperatures the voltage drop $U_1$ across the optoelectronic component 110 is relatively small, as is illustrated for example in FIG. 1B. The voltage $U_2$ dropped across the electrothermal transducer 120 increases in the circuit, for example illustrated in FIG. 1C, the voltage $U_A$ at the output 102 of the linear regulator 124 and thus reduces the regulator range or the temperature rise of the linear regulator 124, for example from the range $U_{in}$–$U_1$ ($T_{max}$) to the range $U_{in}$–$U_A$ ($T_{max}$). The voltage between $U_{in}$ and $U_1$ ($T_{min}$) and respectively $U_A$ ($T_{min}$) is the voltage which, independently of the load, is dropped across the linear regulator 124 during operation depending on the design of the linear regulator 124, also referred to as dropout voltage, for example ~1.5 V.

The electrical voltage $U_2$ dropped across the electrothermal transducer 120 is less than or equal to the voltage $U_3$ which would be dropped across the variable resistor in a driver with linear regulator 124, that is to say would be converted into heat. Consequently, the electrothermal transducer 120, for example a Peltier element, in various embodiments of the optoelectronic component device, cannot be an additional power consumer since the electrothermal transducer 120 only consumes or partly consumes the voltage $U_3$ that is otherwise to be converted into waste heat.

In various embodiments, at low temperatures (T<T*) at which a high voltage $U_1$ is dropped across the optoelectronic component 110, the electrothermal transducer 120 can be bridged by the switch circuit 122 with a switch S. In this case, T* can be a predefined temperature at which the electrothermal transducer 120 is bridged. The predefined temperature T* can be dependent on the configuration of the optoelectronic component 110, of the electrothermal transducer 120, for example the cooling or heating power thereof; and/or the thermal coupling of the electrothermal transducer 120 to the optoelectronic component 110 and/or the surroundings of the optoelectronic component. The predefined temperature T* can be chosen for example in such a way that $U_A$ (T<T*) is less than or equal to $U_1$ (T<T*); or less than or equal to $U_{in}$.

After the electrothermal transducer 120 has been bridged, it no longer cools the optoelectronic component 110, for example since cooling is not necessary anymore; and thus also does not cause an additional voltage drop kept available by the linear regulator 124. The maximum voltage at the output 102 of the linear regulator 124 can thus be available to the optoelectronic component for T<T*, for example illustrated in FIG. 1B by virtue of $U_A$ following the profile of $U_1$ for T<T*.

As a result, for operating the optoelectronic component device 100, for example, no additional power for operating the electrothermal transducer 120 is necessary relative to an optoelectronic component device 100 without an electrothermal transducer 120.

For illustration, in one embodiment, the optoelectronic component 110 shall be formed as a red stacked organic light emitting diode 110. For a typical luminance of approximately 2500 cd/m², the current density is approximately 15 mA/cm². The required current density is practically independent of temperature, such that for example an OLED 110 having a size of 16 cm² requires a current I of approximately 0.25 A. The OLED 110 has, in the case of the current density predefined by the luminance, for example, a temperature dependence of the operating voltage $U_1$ as illustrated schematically in FIG. 1B. The percentage change in the operating voltage $U_1$ on account of a change in the temperature T of the OLED 110 is substantially independent of the configuration of the organic functional layer structure 212, for example independently of how many organic functional layer structure units 216, 220 the organic functional layer structure 212 includes, for example one, two or more in a stacked fashion; or the color of the light emitted by the OLED 110.

The voltage $U_A$ is regulated such that the setpoint current I set at the linear regulator 124 flows in the series connection, for example illustrated in FIG. 1C. The voltage $U_{in}$–$U_A$=$U_3$ is dropped across the linear regulator 124 and is converted into heat.

In order that the OLED can still be operated with the setpoint current I at $T_{min}$, for example −40° C., a voltage $U_{in}$=$U_1(T_{min})$+$U_3$(~min.)=9.5 V+1.5 V=11 V is required at $T_{min}$. In this case, $U_3$ (minimum)=1.5 V is approximately the voltage which, independently of the load, is dropped across the linear regulator 124 during operation.

During the operation of the OLED 110 at T>$T_{min}$, for example at room temperature (RT)/+25° C., the OLED has a forward voltage of $U_1$(RT)~6 V and a voltage $U_3$ (RT) of 11 V—approx. 6V=~5 V, for example, is thus dropped in the case of a fixed voltage $U_{in}$=11 V at the linear regulator 124. Consequently, in the example 5/11 of the total power at room temperature is converted into heat at the linear regulator 124 and only 6/11 of the total power is available in the OLED 110 for conversion into the electromagnetic radiation. At a voltage $U_{in}$=11 V, the voltage $U_2$=$U_{in}$–$U_1$–$U_3$=approx. 11 V–6 V–1.5 V=3.5 V for the cooling of the OLED 110 is available to the Peltier element at the same temperature. At low temperatures T<T*, the operating voltage at the OLED 110 can be a maximum. In various embodiments, at these temperatures the Peltier element is not operated and/or bridged by a switch S. At higher temperatures the OLED 110 requires a lower operating voltage $U_1$. The voltage $U_{in}$–$U_1$ (T>Tmin) is not required for the operation of the OLED 110 and can be used for operating the Peltier element. The Peltier element reduces the operating temperature of the OLED 110 and of the linear regulator 124 since $U_3$ is reduced by the Peltier element; and can thus increase the operating life of the optoelectronic component device 100. The operating voltage $U_1$ for the OLED 110 decreases with increasing temperature T>$T_{min}$, while the operating voltage $U_2$ of the Peltier element increases with increasing temperature. The current intensity is predefined by the application of the OLED 110, for example by the application-specific luminance of the OLED 110. As a result, it is possible to reduce the voltage range to be kept available in the series connection. In other words: the regulator range can be reduced and a linear regulator 124 having a smaller regulator range can thus be used.

In other words:

For the use of the OLED in the entire temperature range, from for example –40° C. to +85° C., a voltage $U_{in}$ of 11 V can be kept available, for example.

At 50° C. the OLED requires for example a voltage of approximately 5.5 V. For the electrothermal transducer 120 formed for example as a Peltier element, $U_{in}$–$U_1$–$U_3$ for the cooling of the OLED is available to the Peltier element, that is to say for example=approx. 11 V–5.5 V–1.5 V=approx. 4 V.

After plotting the cooling power (not illustrated), that is to say the heat $Q_C$(W) drawn from the cold side as a function of the temperature difference between the cold and hot sides of the Peltier element (ΔT(° C.)), it is found that in the case of the current of 0.25 A up to approximately 5 W heat can be dissipated for example by a simple, conventional Peltier element. In this case, the voltage drop across the Peltier element is less than 1.5 V. The OLED can itself be cooled with such a simple Peltier element at an ambient temperature of 50° C. to a temperature approximately 5° C. below the ambient temperature.

The heat input as a result of the operation of the OLED is approximately I·U=5.5 V·0.25 A=1.3 W. Consequently, the cooling power of the Peltier element is thus still sufficient to compensate for the intrinsic heating of the OLED and even to cool it still further.

OLEDs that emit a deep-red light and non-stacked OLEDs require, for the same luminance of 2500 cd/m² as in the example above, a current I having a higher current intensity, for example approximately 30 mA/cm² to 40 mA/cm², and 4 V to 5 V at 25° C. Consequently, such an OLED 110 having a size of 16 cm² requires a current having a current intensity of approximately about 0.5 A. At 50° C. approximately $U_{in}$–$U_1$–$U_3$=approx. 1.5·4.5 V–4 V–1.5 V=1.25 V is available to the Peltier element as above in the example. As a result of the higher current, a higher quantity of heat can be dissipated by the Peltier element and the OLED 110 can be cooled to a lower temperature than in the example above.

The higher the current in the series connection, the better suited Peltier elements are as electrothermal transducer 120 for cooling the optoelectronic component 110. This property of Peltier elements is ideal for OLEDs since, with a higher current required for example for a deeper hue, for example for a deep-red, a higher power is also fed in and thus also converted into heat. The optoelectronic component device 100 including an electrothermal transducer 120 is thus particularly suitable for applications in which the optoelectronic component 110 is operated with a high intensity. In the automotive sector, such applications are for example the signal lights such as, for example, brake lights, which are operated with a higher luminance than tail lights. In this case, the higher current enables a more efficient cooling by the Peltier element. On account of the more intense intrinsic heating of the optoelectronic component 110 at these relatively high current densities, the cooling of the optoelectronic component 110 is of great importance for example with regard to the operating life.

In various embodiments, the optoelectronic component 110 includes, for example illustrated schematically in FIG. 2A, a substrate 230, an electrically active region 206 on the substrate 230, and an encapsulation structure 228 above and around the electrically active region 206.

The substrate 230 may include a carrier 202 and a first barrier layer 204.

The carrier 202 may include or be formed from glass, quartz and/or a semiconductor material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The carrier 202 may include or be formed from a metal, for example copper, silver, gold, platinum, iron, for example a metal compound, for example steel.

The carrier 202 can be embodied as opaque, translucent or even transparent. The carrier 202 can be a part of a mirror structure or form the latter. The carrier 202 can have a mechanically rigid region and/or a mechanically flexible region or be formed in this way, for example as a film. The carrier 202 can be formed as a waveguide for electromagnetic radiation, for example can be transparent or translucent with respect to the emitted or absorbed electromagnetic radiation of the optoelectronic component 200.

The first barrier layer 204 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 204 can be formed by one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by other suitable deposition methods.

In the case of a first barrier layer 204 including a plurality of partial layers, all the partial layers can be formed by an atomic layer deposition method. A layer sequence including only ALD layers can also be designated as a "nanolaminate".

In the case of a first barrier layer 204 including a plurality of partial layers, one or a plurality of partial layers of the first barrier layer 204 can be deposited by a different deposition method than an atomic layer deposition method, for example by a vapor deposition method.

The first barrier layer 204 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 204 may include one or a plurality of high refractive index materials, for example one or a plurality of materials having a high refractive index, for example having a refractive index of at least 2.

Furthermore, it should be pointed out that, in various embodiments, a first barrier layer 204 can also be entirely dispensed with, for example for the case where the carrier 202 is formed in a hermetically impermeable fashion, for example includes or is formed from glass, metal, metal oxide.

The active region 206 is an electrically active region 206 and/or an optically active region 206. The active region 206 is for example the region of the optoelectronic component 110 in which electric current for the operation of the optoelectronic component 110 flows and/or in which electromagnetic radiation is generated and/or absorbed. The electrically active region 206 is formed for converting the electric current I into the electromagnetic radiation.

The electrically active region 206 may include a first electrode 210, an organic functional layer structure 212 and a second electrode 214.

The organic functional layer structure 212 may include one, two or more functional layer structure units and one, two or more intermediate layer structure(s) between the layer structure units. The organic functional layer structure 212 may include for example a first organic functional layer structure unit 216, an intermediate layer structure 218 and a second organic functional layer structure unit 220.

The first electrode 204 can be formed as an anode or as a cathode.

The first electrode 210 may include or be formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 210 composed of a metal or including a metal may include or be formed from one of the following materials: Ag, Pt, Au, Mg, Al, Ba, In, Ca, Sm or Li, and compounds, combinations or alloys of these materials. The first electrode 210 may include as transparent conductive oxide one of the following materials: for example metal oxides: for example zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 210 may include a layer or a layer stack of a plurality of layers of the same material or different materials. The first electrode 210 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 204 can have for example a layer thickness in a range of 10 nm to 500 nm, for example of less than 25 nm to 250 nm, for example of 50 nm to 100 nm.

The first electrode 210 can have a first electrical terminal, to which a first electrical potential can be applied. The first electrical potential can be provided by an energy source, for example a current source or a voltage source. Alternatively, the first electrical potential can be applied to an electrically conductive carrier 202 and the first electrode 210 can be electrically supplied indirectly through the carrier 202. The first electrical potential can be for example the ground potential or some other predefined reference potential.

FIG. 2A illustrates an optoelectronic component 110 including a first organic functional layer structure unit 216 and a second organic functional layer structure unit 220. In various embodiments, however, the organic functional layer structure 212 also includes one or more than two organic functional layer structures, for example 3, 4, 5, 6, 7, 8, 9, 10, or even more, for example 15 or more, for example 70.

The first organic functional layer structure unit 216 and the optionally further organic functional layer structures can be formed identically or differently, for example include an identical or different emitter material. The second organic functional layer structure unit 220, or the further organic functional layer structure units can be formed like one of the below-described configurations of the first organic functional layer structure unit 216.

The first organic functional layer structure unit 216 may include a hole injection layer, a hole transport layer, an emitter layer, an electron transport layer and an electron injection layer.

In an organic functional layer structure unit 212, one or a plurality of the layers mentioned can be provided, wherein identical layers can have a physical contact, can be only electrically connected to one another or can even be formed in a manner electrically insulated from one another, for example can be formed alongside one another. Individual layers of the layers mentioned can be optional.

A hole injection layer can be formed on or above the first electrode 210. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl)benzidine); spiro-TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-

9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spiro-bifluorene); 9,9-bis[4-(N,N-bisbiphenyl-4-ylamino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenyl-amino)phenyl]-9H-fluorene; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolyl-amino)phenyl]cyclohexane; 2,2',7,7'-tetra(N,N-di-tolyl)aminospirobifluorene; and/or N,N,N',N'-tetranaphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB (N,N'-bis(naphthalen-2-yl)-N,N'-bis(phenyl)-benzidine); TPD (N,N'-bis(3-methylphenyl)-N,N'-bis(phenyl)-benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-di-phenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolylamino)phenyl]cyclohexane; 2,2',7,7'-tetra(N,N-ditolyl)aminospirobifluorene; and N,N,N',N'-tetranaphthalen-2-ylbenzidine, a tertiary amine, a carbazole derivative, a conductive polyaniline and/or polyethylene dioxythiophene.

The hole transport layer can have a layer thickness in a range of approximately 5 nm to approximately 50 nm, for example in a range of approximately 10 nm to approximately 30 nm, for example approximately 20 nm.

An emitter layer can be formed on or above the hole transport layer. Each of the organic functional layer structure units 216, 220 may include in each case one or a plurality of emitter layers, for example including fluorescent and/or phosphorescent emitters.

An emitter layer may include or be formed from organic polymers, organic oligomers, organic monomers, organic small, non-polymer molecules ("small molecules") or a combination of these materials.

The optoelectronic component 110 may include or be formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)-phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')bipyridine]ruthenium (III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by thermal evaporation. Furthermore, polymer emitters can be used which can be deposited for example by a wet-chemical method, such as, for example, a spin coating method.

The emitter materials can be embedded in a suitable manner in a matrix material, for example a technical ceramic or a polymer, for example an epoxy; or a silicone.

In various embodiments, the emitter layer has a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 216 may include one or a plurality of emitter layers embodied as hole transport layer.

Furthermore, the organic functional layer structure unit 216 may include one or a plurality of emitter layers embodied as electron transport layer.

An electron transport layer can be formed, for example deposited, on or above the emitter layer.

The electron transport layer may include or be formed from one or a plurality of the following materials: NET-18; 2,2',2"-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolatolithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris (2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or above the electron transport layer. The electron injection layer may include or be formed from one or a plurality of the following materials: NDN-26, MgAg, $CS_2CO_3$, $Cs_3PO_4$, Na, Ca, K, Mg, Cs, Li, LiF; 2,2',2"-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolatolithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl] benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 212 including two or more organic functional layer structure units 216, 220, the second organic functional layer structure unit 220 can be formed above or alongside the first functional layer structure units 216. An intermediate layer structure 218 can be formed electrically between the organic functional layer structure units 216, 220.

In various embodiments, the intermediate layer structure 218 is formed as an intermediate electrode 218, for example in accordance with one of the configurations of the first electrode 210. An intermediate electrode 218 can be electrically connected to an external voltage source. The external voltage source can provide a third electrical potential, for example, at the intermediate electrode 218. However, the intermediate electrode 218 can also have no external electrical connection, for example by the intermediate electrode having a floating electrical potential.

In various embodiments, the intermediate layer structure 218 is formed as a charge generating layer structure 218 (charge generation layer CGL). A charge generating layer structure 218 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 218 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 218 can furthermore have a diffusion barrier between adjacent layers.

Each organic functional layer structure unit 216, 220 can have for example a layer thickness of a maximum of approximately 3 µm, for example a layer thickness of a maximum of approximately 1 µm, for example a layer thickness of a maximum of approximately 300 nm.

The optoelectronic component 110 can optionally include further organic functional layers, for example arranged on or above the one or the plurality of emitter layers or on or above the electron transport layer(s). The further organic functional layers can be for example internal or external coupling-in/coupling-out structures that further improve the functionality and thus the efficiency of the optoelectronic component 110.

The second electrode 214 can be formed on or above the organic functional layer structure 212 or, if appropriate, on or above the one or the plurality of further organic functional layer structures and/or organic functional layers.

The second electrode 214 can be formed in accordance with one of the configurations of the first electrode 210, wherein the first electrode 210 and the second electrode 214 can be formed identically or differently. The second electrode 214 can be formed as an anode, that is to say as a hole-injecting electrode, or as a cathode, that is to say as an electron-injecting electrode.

The second electrode 214 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The encapsulation structure 228 is formed in such a way that it protects the active region 206 against indiffusion of a substance that is harmful to the active region 206. The encapsulation structure 228 may include for example a second barrier layer 208, a close connection layer 222 and a cover 224.

The second barrier layer 208 can be formed on the second electrode 214.

The second barrier layer 208 can also be referred to as thin film encapsulation (TFE). The second barrier layer 208 can be formed in accordance with one of the configurations of the first barrier layer 204.

Furthermore, it should be pointed out that, in various embodiments, a second barrier layer 208 can also be entirely dispensed with. In such a configuration, the optoelectronic component 110 may include for example a further encapsulation structure, as a result of which a second barrier layer 208 can become optional, for example a cover 224, for example a cavity glass encapsulation or metallic encapsulation.

Furthermore, in various embodiments, in addition, one or a plurality of coupling-in/-out layers can also be formed in the optoelectronic component 200, for example an external coupling-out film on or above the carrier 202 (not illustrated) or an internal coupling-out layer (not illustrated) in the layer cross section of the optoelectronic component 200. The coupling-in/-out layer may include a matrix and scattering centers distributed therein, wherein the average refractive index of the coupling-in/-out layer is greater or less than the average refractive index of the layer from which the electromagnetic radiation is provided. Furthermore, in various embodiments, in addition, one or a plurality of antireflection layers (for example combined with the second barrier layer 208) can be provided in the optoelectronic component 110.

In various embodiments, a close connection layer 222, for example composed of an adhesive or a lacquer, is provided on or above the second barrier layer 208. By the close connection layer 222, a cover 224 can be closely connected, for example adhesively bonded, on the second barrier layer 208.

A close connection layer 222 composed of a transparent material may include for example particles which scatter electromagnetic radiation, for example light-scattering particles. As a result, the close connection layer 222 can act as a scattering layer and lead to an improvement in the color angle distortion and the coupling-out efficiency.

The light-scattering particles provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable, provided that they have a refractive index that is different than the effective refractive index of the matrix of the close connection layer 222, for example air bubbles, acrylate, or hollow glass beads. Furthermore, by way of example, metallic nanoparticles, metals such as gold, silver, iron nanoparticles, or the like can be provided as light-scattering particles.

The close connection layer 222 can have a layer thickness of greater than 1 µm, for example a layer thickness of a plurality of µm. In various embodiments, the close connection layer 222 may include or be a lamination adhesive.

The close connection layer 222 can be designed in such a way that it includes an adhesive having a refractive index that is less than the refractive index of the cover 224. Such an adhesive can be for example a low refractive index adhesive such as, for example, an acrylate having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 212, for example in a range of approximately 1.7 to approximately 2.0. Furthermore, a plurality of different adhesives can be provided which form an adhesive layer sequence.

In various embodiments, between the second electrode 214 and the close connection layer 222, an electrically insulating layer (not shown) is also formed, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, a close connection layer 222 is optional, for example if the cover 224 is formed directly on the second barrier layer 208, for example a cover 224 composed of glass that is formed by plasma spraying.

Furthermore, a so-called getter layer or getter structure, for example a laterally structured getter layer, can be arranged (not illustrated) on or above the electrically active region 206.

The getter layer may include or be formed from a material that absorbs and binds substances that are harmful to the electrically active region 206. A getter layer may include or be formed from a zeolite derivative, for example. The getter layer can be formed as translucent, transparent or opaque and/or non-transmissive with respect to the electromagnetic radiation that is emitted and/or absorbed in the optically active region.

The getter layer can have a layer thickness of greater than approximately 1 µm, for example a layer thickness of a plurality of µm.

In various embodiments, the getter layer includes a lamination adhesive or is embedded in the close connection layer 222.

A cover 224 can be formed on or above the close connection layer 222. The cover 224 can be closely connected to the electrically active region 206 by the close connection layer 222 and can protect said region from harmful substances. The cover 224 can be for example a glass cover 224, a metal film cover 224 or a sealed plastics film cover 224. The glass cover 224 can be closely connected to the second barrier layer 208 or the electrically active region 206 for example by frit bonding (glass frit bonding/glass soldering/seal glass bonding) by a conventional glass solder in the geometric edge regions of the organic optoelectronic component 200.

The cover 224 and/or the close connection layer 222 can have a refractive index (for example at a wavelength of 633 nm) of 1.55.

In various embodiments, the encapsulation structure 228 includes the electrothermal transducer 120 or is thermally coupled thereto, for example illustrated by the arrow 232 in FIG. 2A.

In various embodiments, the substrate 230 includes the electrothermal transducer 120 or is thermally coupled thereto. In various embodiments, the optoelectronic component 110 furthermore includes an encapsulation structure 228 on or above the electrically active region 206, for example illustrated by the arrow 234 in FIG. 2A.

The electrical coupling or series connection of optoelectronic component 110, electrothermal transducer 120 and linear regulator 124 can be effected for example in or on an optically active region in the optoelectronic component device, for example in an edge region of the optoelectronic component 110; for example by one or a plurality of through contacts and/or wire connections.

Figure 2B:
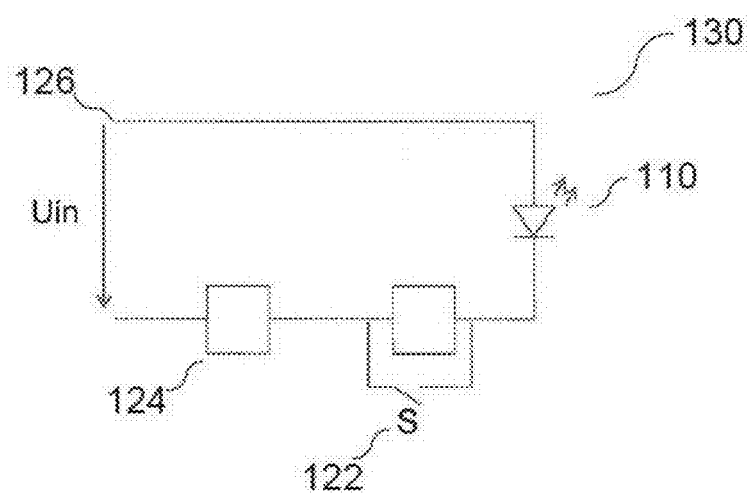
Figure 2C:
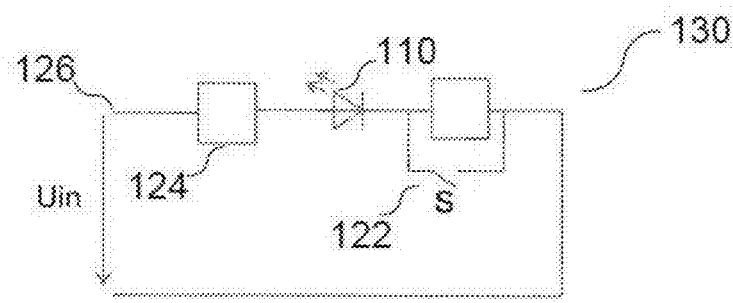

In various embodiments, the order of the individual components of the optoelectronic component device in the series connection can be interchanged, for example illustrated in FIGS. 2B and 2C.

In one embodiment, the optoelectronic component 110 is arranged electrically between the energy source 126 and the electrothermal transducer 120, and the electrothermal transducer 120 is arranged between the optoelectronic component 110 and the linear regulator 124; for example illustrated in FIG. 2B. Alternatively, the linear regulator 124 is arranged electrically between the energy source 126 and the optoelectronic component 110, and the optoelectronic component 110 is arranged between the linear regulator 124 and the electrothermal transducer 120; for example illustrated in FIG. 2C.

In various embodiments, a method 300 for producing an optoelectronic component device 100 is provided, for example illustrated schematically in FIG. 3.

In various embodiments, the method 300 includes providing 302 a linear regulator 124. The linear regulator 124 is designed for providing an electric current I.

In various embodiments, the linear regulator 124 is or includes a series regulator. The series regulator is or includes an adjustable current regulator and/or an adjustable voltage regulator or is configured in this way. Furthermore, in various embodiments, the linear regulator 124 may include a quadrature regulator.

In various embodiments, an electrical energy source 126 is furthermore provided, wherein the linear regulator 124 is electrically coupled to the electrical energy source in such a way that the linear regulator 124 provides the electric current I. The electrical energy source is formed for example for providing the electric current I, for example in a temperature range of the optoelectronic component device 110 of $T_{min}$ to $T_{max}$, for example of approximately −40° C. to approximately +85° C.

In various embodiments, the method 300 includes forming 302 an optoelectronic component 110 formed for converting the electric current I into an electromagnetic radiation. In various embodiments, forming 304 the optoelectronic component 110 can be providing the optoelectronic component 110.

In various embodiments, forming 304 the optoelectronic component 110 includes providing a substrate 202, 230. An electrically active region 206 is formed on the substrate 202, 230, for example in accordance with one of the configurations described above. The electrically active region 206 is formed for converting the electric current into the electromagnetic radiation. In various embodiments, the substrate 202, 230 includes the electrothermal transducer 120; the substrate 202, 230 is the electrothermal transducer 120 or is thermally coupled thereto; for example adhesively bonded by a thermally conductive adhesive, for example a thermally conductive paste.

In various embodiments, forming 304 the optoelectronic component 110 includes forming an encapsulation structure 228. The encapsulation structure 228 is formed in such a way that it protects the electrically active region 206 against indiffusion of a substance that is harmful to the electrically active region 206. In various embodiments, the encapsulation structure 228 includes the electrothermal transducer 120; the cover 224 of the encapsulation structure 228 is the electrothermal transducer 120 or is thermally coupled thereto, for example illustrated by the arrow 232 in FIG. 2A.

In various embodiments, the optoelectronic component 110 is formed with an organic functional layer structure 212 in accordance with one of the configurations described; wherein the organic functional layer structure 212 is formed with an electroluminescent substance. The electroluminescent substance is designed for converting the electric current I into an electromagnetic radiation. The electromagnetic radiation is or includes a visible light or an infrared radiation.

In various embodiments, the method 300 includes forming 306 an electrothermal transducer 120.

In various embodiments, the electrothermal transducer 120 includes a Peltier element or is formed in this way. In various embodiments, forming 306 the electrothermal transducer 120 can be providing the electrothermal transducer 120.

In various embodiments, the electrothermal transducer 120 is formed and thermally coupled to the optoelectronic component 110 in such a way that the electrothermal transducer 120 has a first surface having a first temperature and a second surface having a second temperature during operation, wherein the second temperature is less than the first temperature, wherein the difference between first temperature and second temperature is a temperature difference. Thermal coupling can be coupling the first surface or the second surface to the optoelectronic component 110; for example in the form of a physical contact. In various embodiments, the electrothermal transducer 120 is arranged for cooling and/or heating the optoelectronic component 110, for example on the substrate 230 or the encapsulation structure 228. The temperature difference can lead to cooling or heating of the optoelectronic component 110 by the thermal coupling of the optoelectronic component 110 to the electrothermal transducer 120.

In various embodiments, the electrothermal transducer 120 is formed with a heat distribution structure, is thermally coupled to such a heat distribution structure or includes such a heat distribution structure. The heat distribution structure can be arranged for example in a manner facing away with respect to the optoelectronic component 110, for example in order to amplify the heating or cooling power. The heat distribution structure can be an active heat distribution structure, for example a heat conducting tube, a fan and/or a further electrothermal transducer 120. Alternatively or additionally, the heat distribution structure can be or include a passive heat distribution structure, for example a heat sink.

In various embodiments, the heat distribution structure is formed with a first surface and a second surface. The first surface and the second surface of the heat distribution structure are formed for a heat exchange of the heat distribution structure. The first surface is thermally coupled to the electrothermal transducer 120. The second surface can be arranged in a manner thermally isolated from the optoelectronic component device 100.

In various embodiments, the electrothermal transducer 120 is formed with one or a plurality of electrothermal transducer(s) 120. An electrothermal transducer 120 may include one or a plurality of Peltier element(s) or be formed in this way.

In various embodiments, at least one further electrothermal transducer 120 is thermally coupled to the first electrothermal transducer 120 in such a way that the further electrothermal transducer 120 has a third surface having approximately the second temperature and a fourth surface having a third temperature, wherein the absolute value of the temperature difference between the third temperature and the first temperature is greater than the absolute value of the temperature difference between the second temperature and the first temperature. In other words: the further electrothermal transducer 120 can be arranged in such a way that it amplifies the cooling or heating power of the first electrothermal transducer 120.

The further electrothermal transducer 120 can be electrically coupled in series with the first electrothermal transducer 120. Alternatively, the further electrothermal transducer 120 can be electrically coupled in parallel with the first electrothermal transducer.

The electrothermal transducer 120 is thermally coupled to the optoelectronic component 110. In various embodiments, the electrothermal transducer 120 is formed on the optoelectronic component. Alternatively or additionally, the optoelectronic component 110 is formed on the electrothermal transducer 120. In various embodiments, the method 300 includes forming a heat conducting structure between the optoelectronic component 110 and the electrothermal transducer 120, for example forming, arranging and/or connecting a heat conducting structure to the optoelectronic component 110 and forming, arranging and/or connecting the electrothermal transducer 120 on the heat conducting structure. A heat conducting structure can be provided for example in a configuration in which the optoelectronic component 110 has a smaller thermally couplable surface than the electrothermal transducer 120. In this configuration, the heat conducting structure can distribute the heat of the thermally couplable surface of the optoelectronic component 110 over the thermally couplable surface of the electrothermal transducer 120.

In various embodiments, the optoelectronic component 110 is thermally and/or electrically coupled to the electrothermal transducer 120 by the heat conducting structure.

In various embodiments, the heat conducting structure is a thermally conductive paste or is formed therefrom. The thermally conductive paste can be formed as or include a thermally conductive adhesive layer, and the optoelectronic component 110 can be connected to the electrothermal transducer by the thermally conductive adhesive layer. Alternatively or additionally, the heat conducting structure can be or include a thermally conductive film, for example a metal-containing film, for example a metal-coated film or a metal film.

Alternatively, the electrothermal transducer 120 is arranged at a distance from the optoelectronic component 110 in such a way that an air gap or vacuum is formed between the electrothermal transducer 120 and the optoelectronic component 110, and the electrothermal transducer 120 is thermally coupled to the optoelectronic component 110 via or through the air gap or the vacuum, for example in that the distance is small, for example less than 1 µm, for example less than 0.5 µm, for example less than 0.1 µm.

The optoelectronic component 110, the electrothermal transducer 120 and the linear regulator 124 are formed and interconnected in such a way that they are electrically connected in series with one another. In various embodiments, electrically connecting in series with one another includes forming an electrical wire connection (wire bonding). By way of example, the optoelectronic component 110 and the electrothermal transducer can be electrically coupled by the wire connection. Alternatively or additionally, the optoelectronic component 110 and the electrothermal transducer 120 can be formed with a common electrically conductive layer and be electrically coupled by the latter, for example by a common electrode.

In various embodiments, forming 306 the electrothermal transducer may include forming a switch circuit 122. The switch circuit 122 is formed for electrically bridging the electrothermal transducer 120 upon a predefined operating parameter being attained, for example with regard to the optoelectronic component, the optoelectronic component device and/or the electrothermal transducer exceeding or undershooting a predefined temperature, a predefined voltage drop and/or a predefined electric current.

In the case of an electrothermal transducer 120 including one, two or more electrothermal transducers 120, for example one, two or more Peltier elements, the switch circuit may include one, two or more switches designed to bridge one, two or more electrothermal transducers 120. By way of example, the switch circuit 124 can be formed for bridging two or more electrothermal transducers in the case of different predefined operating parameters.

For example a first switch that switches upon a predefined temperature T* of the optoelectronic component being attained, and a second switch that switches upon a predefined voltage drop across the optoelectronic component being attained.

For example a first switch that switches upon a first predefined temperature T* of the optoelectronic component being attained, and a second switch that switches upon a second predefined temperature of the optoelectronic component being attained.

The first switch can be designed for example for bridging a first electrothermal transducer, for example a first Peltier element. The second switch can be designed for example for bridging a second electrothermal transducer. Alternatively, the second switch can for example also be designed for bridging the first electrothermal transducer.

As a result, for example, the two or more switches can be designed for predefining an operating parameter range in which one or a plurality of electrothermal transducer(s) is/are energized. Alternatively or additionally, the two or more switches can be designed for predefining different switching criteria of a switch. For example with regard to the optoelectronic component switching the switch designed for bridging the electrothermal transducer upon a predefined temperature or a predefined voltage drop being attained. For example for the case of an aging-dependent and temperature-dependent resistance of an element of the optoelectronic component device.

As a result, for example, at relatively high temperatures of the optoelectronic component 110, by the two or more electrothermal transducers 120, which are thermally coupled to one another for example as described above and are electrically connected in series with one another, the cooling of the optoelectronic component 110 can be amplified and the heating of the linear regulator 124 can be reduced, for example with the same current intensity. The switch circuit 122 can be formed in such a way that individual or a group of electrothermal transducers 120 are bridged at low temperatures. This makes it possible for example to prevent the voltage drop $U_2$ across the two or more electrothermal transducers 120 from being greater than the voltage available by $U_{in}-U_A-U_3$ (minimum).

In various embodiments, the switch circuit 122 is formed in such a way that the switch circuit 122, for example the switch S, itself switches in the case of the predefined operating parameter. By way of example, the switch S or switch circuit 122, in the case of a predefined temperature T* as operating parameter, can be formed as a temperature switch, for example in the form of a bimetallic switch or a thermistor. Alternatively or additionally, the switch circuit 122 is formed with an electrically switchable switch, for example with a transistor or thyristor, for example as a thermally switchable thyristor in the case of a predefined temperature T* as operating parameter.

In various embodiments, the switch circuit 122 is formed with a determiner circuit. The determiner circuit is formed for determining an operating parameter, for example of the optoelectronic component 110, of the optoelectronic component device 100 and/or of the electrothermal transducer 120. The determiner circuit is coupled to an electrically switchable switch S of the switch circuit 122 in such a way that the switch S switches the switch, for example switches the bridging of the electrothermal transducer 120, on the basis of the comparison of the measured operating parameter with respect to the predefined operating parameter.

The bridging can be coupled for example to the electromagnetic radiation to be emitted. By way of example, the operating parameter can be the electric current, for example the current intensity or current density, that flows through the optoelectronic component 110. The luminance of the emitted electromagnetic radiation can decrease for example in a manner governed by aging. In the case of an excessively low determined current with respect to a predefined current for emitting an electromagnetic radiation with a predefined luminance, the switch can for example bridge the electrothermal transducer 120 in order to enable the predefined current through the component and in order to emit the predefined electromagnetic radiation. For setting the predefined electromagnetic radiation, for example a time-averaged luminance, or for setting the cooling power of the electrothermal transducer, the bridging can for example be clocked, for example in a pulse-modulated manner.

Figure 4:
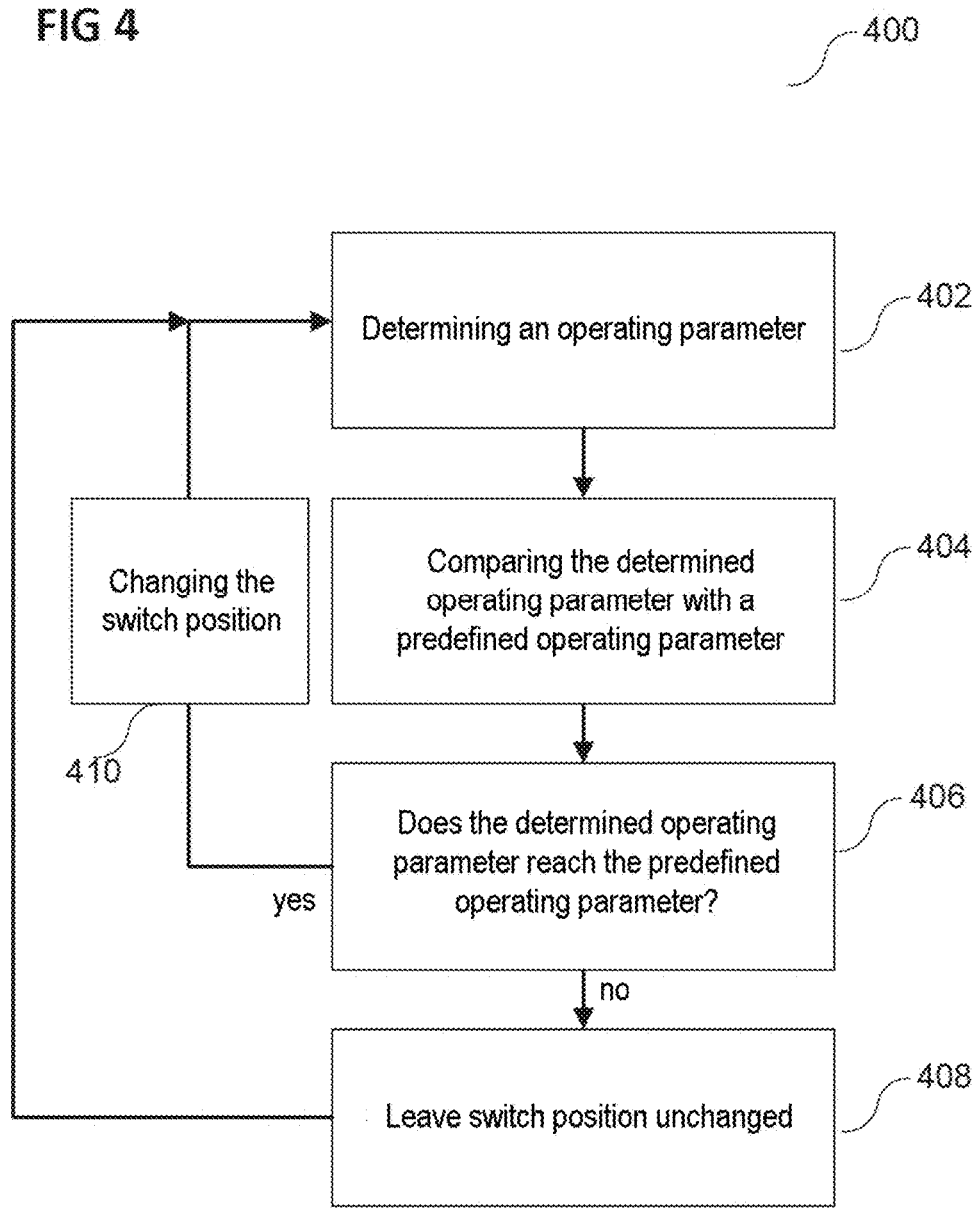
FIG. 4 shows a schematic illustration of a method for operating an optoelectronic component device in accordance with various embodiments.
Figure 5:
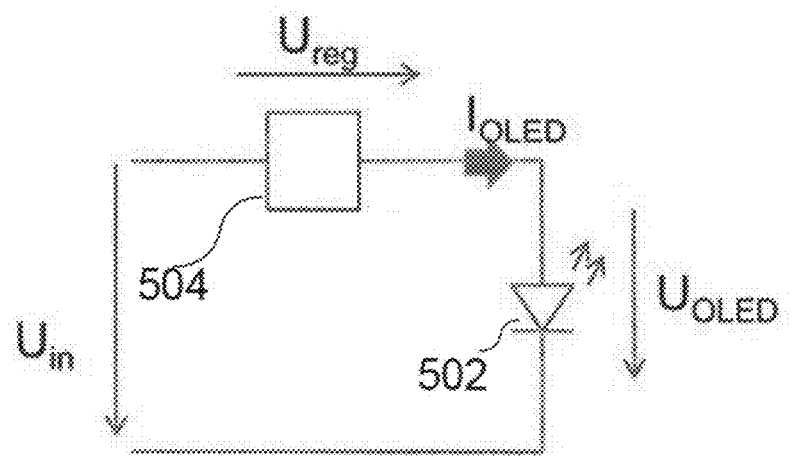
FIG. 5 shows a schematic illustration of a conventional optoelectronic component device.

In various embodiments, a method 400 for operating an optoelectronic component 100 described above is provided, for example illustrated in FIG. 4.

The method 400 includes determining 402 an operating parameter, for example an operating parameter described above, for example of the optoelectronic component 110, for example determining the temperature T of the optoelectronic component 110, for example measuring the temperature T of the optoelectronic component 110.

Furthermore, the method includes comparing 404 the determined operating parameter with a predefined operating parameter, for example comparing the measured temperature with the predefined temperature T*.

In various embodiments, comparing 404 includes determining the absolute value of the difference and/or the sign of the difference of the determined operating parameter with respect to the predefined operating parameter, or vice versa. For example comparing the temperature values of measured temperature T and predefined temperature T*.

Furthermore, the method includes, on the basis of the result of the comparison, changing 410 or leaving 408 the position of a switch S for bridging the electrothermal transducer 120 of the switch circuit, as described above for example; for example opening the switch S, closing the switch S, or leaving the switch S open or closed.

The method 400 can be repeated continuously or at time intervals.

In various embodiments, an optoelectronic component device, a method for producing an optoelectronic component device and a method for operating an optoelectronic component device are provided which make it possible to increase the operating life of OLEDs in a large temperature use range in a cost-effective manner, for example of OLEDs in automotive applications having a surface area of a few cm². Furthermore, the temperature dependence of the power consumption of the OLED can be reduced or compensated for. For this purpose for example during operation at relatively high temperatures, the OLED can be cooled by a Peltier element connected in series with it. The Peltier element can at least partly compensate for the temperature dependence of the OLED voltage. Furthermore, the use of a more cost-effective linear regulator having a smaller regulation range can be made possible as a result. In the case of a clocked switch mode power supply instead of the linear regulator, a dedicated current source for the electrothermal transducer can be omitted by the series connection of the optoelectronic component to the electrothermal transducer. Furthermore, at a clocked power supply unit the maximum regulation range (dynamic range) of the clocked power supply unit is advantageously reduced. A more cost-effective component device can thus be realized.

The invention claimed is:

1. An optoelectronic component device, comprising:
   a linear regulator designed for being coupled to an energy source for providing an electric current; and
   an organic light emitting diode comprising a substrate, an electrically active region on the substrate, and an encapsulation structure on or above the electrically active region;
   wherein the electrically active region is formed for converting the electric current into the electromagnetic radiation;
   wherein the encapsulation structure comprises an electrothermal transducer integrally formed with the organic light emitting diode and is formed in such a way that it protects the electrically active region against a diffusion of a substance that is harmful to the electrically active region, and
   wherein the organic light emitting diode, the electrothermal transducer and the linear regulator are electrically connected in series with one another and
   wherein an operating voltage of the electrothermal transducer lowers a voltage drop across the line regulator.

2. The optoelectronic component device as claimed in claim 1,
   wherein the linear regulator is or comprises a series regulator.

3. The optoelectronic component device as claimed in claim 1,
   wherein the electrothermal transducer comprises a Peltier element or is formed in this way.

4. The optoelectronic component device as claimed in claim 1,
   wherein the electrothermal transducer comprises or is thermally coupled to a heat distribution structure.

5. The optoelectronic component device as claimed in claim 1,
   further comprising: a switch circuit formed for electrically bridging the electrothermal transducer upon a predefined operating parameter being attained, wherein the operating parameter is:
   a temperature of the organic light emitting diode or of the optoelectronic component device;
   a voltage drop across the organic light emitting diode and/or the electrothermal transducer; and/or
   an electric current through the organic light emitting diode and/or the electrothermal transducer.

6. The optoelectronic component device as claimed in claim 5,
   wherein the switch circuit comprises a determiner circuit, wherein the determiner circuit is formed for determining an operating parameter of at least the optoelectronic component; wherein the determiner circuit is coupled to an electrically switchable switch of the switch circuit in such a way that the switch switches the bridging of the electrothermal transducer on the basis of the comparison of the measured operating parameter with respect to a predefined operating parameter.

7. The optoelectronic component device as claimed in claim 1, wherein an operating voltage of the organic light emitting element decreases with increasing temperature.

8. The optoelectronic component device as claimed in claim 1, wherein the operating voltage of the electrothermal transducer increases with increasing temperature.

9. The optoelectronic component device as claimed in claim 1,
   further comprising: a switch circuit formed for electrically bridging the electrothermal transducer until a predefined operating parameter being attained, in order to lower the voltage drop across the line regulator by the operating voltage of the electrothermal transducer upon attaining the predefined operating parameter and to provide the whole output voltage of the line regulator to the organic light emitting element until the predefined operating parameter is attained.

10. A method for producing an optoelectronic component device, the method comprising:

providing a linear regulator designed for providing an electric current;

forming an organic light emitting diode comprising a substrate, an electrically active region on the substrate, and an encapsulation structure on or above the electrically active region which is formed for converting the electric current into an electromagnetic radiation, wherein the encapsulation structure is formed such that it comprises an electrothermal transducer integrally formed with the organic light emitting diode and that it protects the electrically active region against a diffusion of a substance that is harmful to the electrically active region; and wherein the optoelectronic component, the electrothermal transducer and the linear regulator are electrically connected in series with one another and wherein an operating voltage of the electrothermal transducer lowers a voltage drop across the line regulator.

* * * * *